US007618065B2

(12) United States Patent
Yau

(10) Patent No.: US 7,618,065 B2
(45) Date of Patent: Nov. 17, 2009

(54) MULTI-FUNCTIONAL COVER

(75) Inventor: Yimwai Yau, Guangdong (CN)

(73) Assignees: Shenzhen Wang Ling Science and Technology Development Co., Ltd., Shenzhen, Guangdong (CN); Hung Yuen Industries Company, Yuen Long, N.T. (HK)

( * ) Notice: Subject to any disclaimer, the term of this patent is extended or adjusted under 35 U.S.C. 154(b) by 445 days.

(21) Appl. No.: 10/590,547

(22) PCT Filed: Feb. 1, 2005

(86) PCT No.: PCT/CN2005/000143

§ 371 (c)(1),
(2), (4) Date: Aug. 22, 2006

(87) PCT Pub. No.: WO2005/080087

PCT Pub. Date: Sep. 1, 2005

(65) Prior Publication Data

US 2007/0187942 A1 Aug. 16, 2007

(30) Foreign Application Priority Data

Feb. 24, 2004 (CN) ........................ 2004 1 0015427

(51) Int. Cl.
*G06F 1/16* (2006.01)
*H05K 5/00* (2006.01)
*H05K 7/00* (2006.01)

(52) U.S. Cl. ..................... 281/29; 361/679.56; 361/683

(58) Field of Classification Search ................ 281/15.1, 281/29; 40/726, 731, 737, 759, 762; 362/98–99; 446/147–148; 206/472, 320, 777, 728, 475; 361/747, 679.3, 679.56; 434/317
See application file for complete search history.

(56) References Cited

U.S. PATENT DOCUMENTS

| | | | | |
|---|---|---|---|---|
| 5,859,628 | A * | 1/1999 | Ross et al. | 345/173 |
| 6,806,867 | B1 * | 10/2004 | Arruda et al. | 345/173 |
| 6,889,057 | B2 * | 5/2005 | Tordera et al. | 455/557 |
| 6,961,237 | B2 * | 11/2005 | Dickie | 361/683 |
| 2004/0233624 | A1 * | 11/2004 | Aisenberg | 361/683 |

* cited by examiner

*Primary Examiner*—Dana Ross
*Assistant Examiner*—Kyle Grabowski
(74) *Attorney, Agent, or Firm*—Raymond Y. Chan; David and Raymond Patent Firm

(57) ABSTRACT

A multi-functional cover for a writing pad to incorporate a utility accessory thereto includes a main body, a plurality of window connectors, and a supporting frame. The main body has a display window formed thereon. The window connectors are spacedly provided on a peripheral boundary of the display window. The supporting frame is detachably attached on the display window of the main body, wherein the supporting frame is adapted for detachably mounting with the utility accessory so as to detachably mount the utility accessory with the writing pad.

12 Claims, 9 Drawing Sheets

MULTI-FUNCTIONAL COVER

BACKGROUND OF THE PRESENT INVENTION

1. Field of Invention

The present invention relates to a cover, and more particularly to a multi-functional cover which incorporates a wide range of utility accessories, such as a Personal Digital Assistance (PDA), a MP3 player, an illumination system, an audio system, and the likes.

2. Description of Related Arts

With the advance of information technology, Personal Digital Assistance (PDAs) have been developed and widely utilized to store a vast amount of personal information. The distinguishing features of PDAs are that they are usually compact in size, light in weight, and have a fairly large amount of storage capacity for convenient use in outdoor environment. Accordingly, PDAs have been extremely popular among businessmen as well as students and they use PDAs for a wide range of different purposes at work, and in schools. On the other hand, people usually utilize some sorts of notebooks or documents files or folders for recording information which require handwritings. At the same time, however, people may also wish to use PDAs and notebooks or retrieve documents from files or folders. So people have to bring PDAs, notebooks, documents files, folders, and other accessories separately when they wish to use them all at the same time. This causes great inconvenience to busy businessmen and students. Moreover, as a matter of fact, conventional covers for those notebooks, files or folders only have two principal functions, namely, protecting the documents and decorating the relevant notebooks, files or folders. In light of all these, conventional covers for notebooks, documents files or folders, have not been developed to cope with the need in this information era.

SUMMARY OF THE PRESENT INVENTION

A main object of the present invention is to provide a multi-functional cover which incorporates a wide range of utility accessories, such as a Personal Digital Assistance (PDA), a MP3 player, an illumination system, an audio system, and the likes.

Accordingly, in order to accomplish the above objects, the present invention provides a multi-functional cover for a writing pad to incorporate a utility accessory thereto, comprising a main body having a display window formed thereon, a plurality of window connectors spacedly provided on a peripheral boundary of the display window, and a supporting frame detachably attached on the display window of the main body, wherein the supporting frame is adapted for detachably mounting with the utility accessory so as to detachably mount the utility accessory with the writing pad.

The supporting frame comprises a frame holder which is quadrilateral in shape, and has a plurality of accessory blockers formed at four corner portions of the supporting frame for retaining the utility accessory within the display window, wherein the supporting frame further has a plurality of through slots spacedly formed on a top and a bottom side of the supporting frame for the window connectors penetrating the through slots respectively so as to connect the window connectors with the supporting frame, wherein the supporting frame further comprises a transparent panel, a biasing panel, and a rear panel mounted in the frame holder for displaying the utility accessory by the supporting frame.

The supporting frame further comprises a plurality of resilient members spacedly mounted at an inner side of the rear panel for normally applying an inward urging force towards the biasing panel so as to normally push the utility accessory towards a front side of the supporting frame to be biased by the accessory blockers for displaying the utility accessory through the display window in a secure manner, wherein the rear panel further has two pushing holes spacedly formed thereon for allowing a user to push the biasing panel and the transparent panel for conveniently detaching the utility accessory from the supporting frame.

The supporting frame is shaped and sized to fittedly receive the utility accessory within the frame holder.

The multi-functional cover, as recited in claim 1, further comprises an affixing arrangement which contains a plurality of affixing slots spacedly formed on the utility accessory at an upper and a bottom side edge of the utility accessory to align with the through slots, wherein the window connectors are adapted to connect with the affixing slots of the utility accessory for detachably mounting the utility accessory with the supporting frame.

Each of the window connectors comprises a first and a second connector member, and a supporting member transversely extended between the first and the second connector members, wherein each of the first connector members is movably mounted onto the corresponding position of the window boundary, each of the window connectors further comprising an tubular metallic connecting member, having a connecting slot formed therein, and a resilient element mounted within the connecting slot of the metallic connecting member for normally exerting an inward biasing force with respect to the window boundary.

The second connector member is arranged to mount with the resilient element and receive in the connecting slot of the metallic connecting member, such that each of the window connectors is capable of longitudinally moving with respective to the connecting slot and the mounting slot.

Finally, the main body further comprises an audio device provided thereon for electrically connecting with the utility accessory, a signal inlet provided on the main body for electrically connecting with an external electrical appliance, a lighting device spacedly mounted on the main body for illuminating the display window, a power system electrically connected with the lighting device for powering up the lighting device to provide illumination, and a control switch mounted on the main body and electrically connecting with the lighting device for selectively controlling an operation thereof.

These and other objectives, features, and advantages of the present invention will become apparent from the following detailed description, the accompanying drawings, and the appended claims.

DETAILED DESCRIPTION OF THE PREFERRED EMBODIMENT

Figure 1:
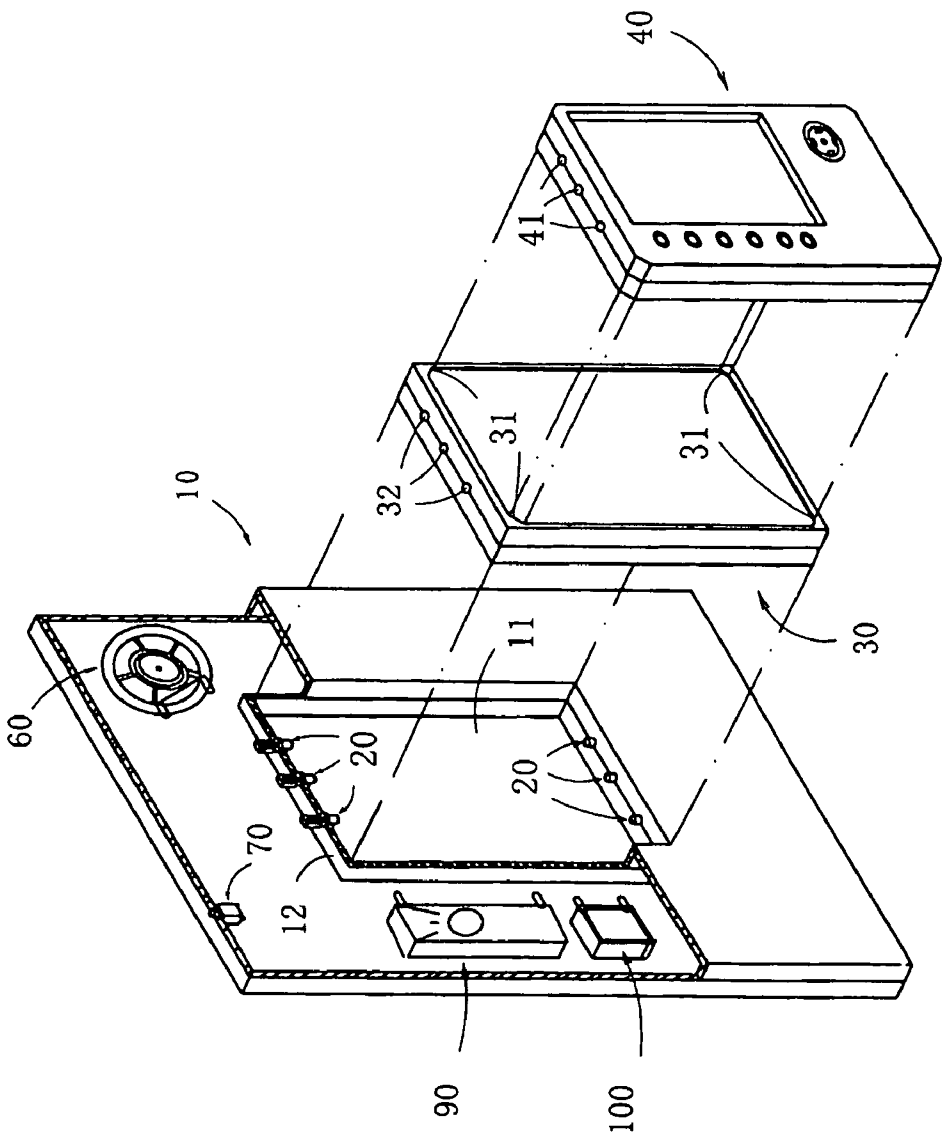
FIG. 1 is an exploded perspective view of a multi-functional cover according to a preferred embodiment of the present invention.
Figure 2A:
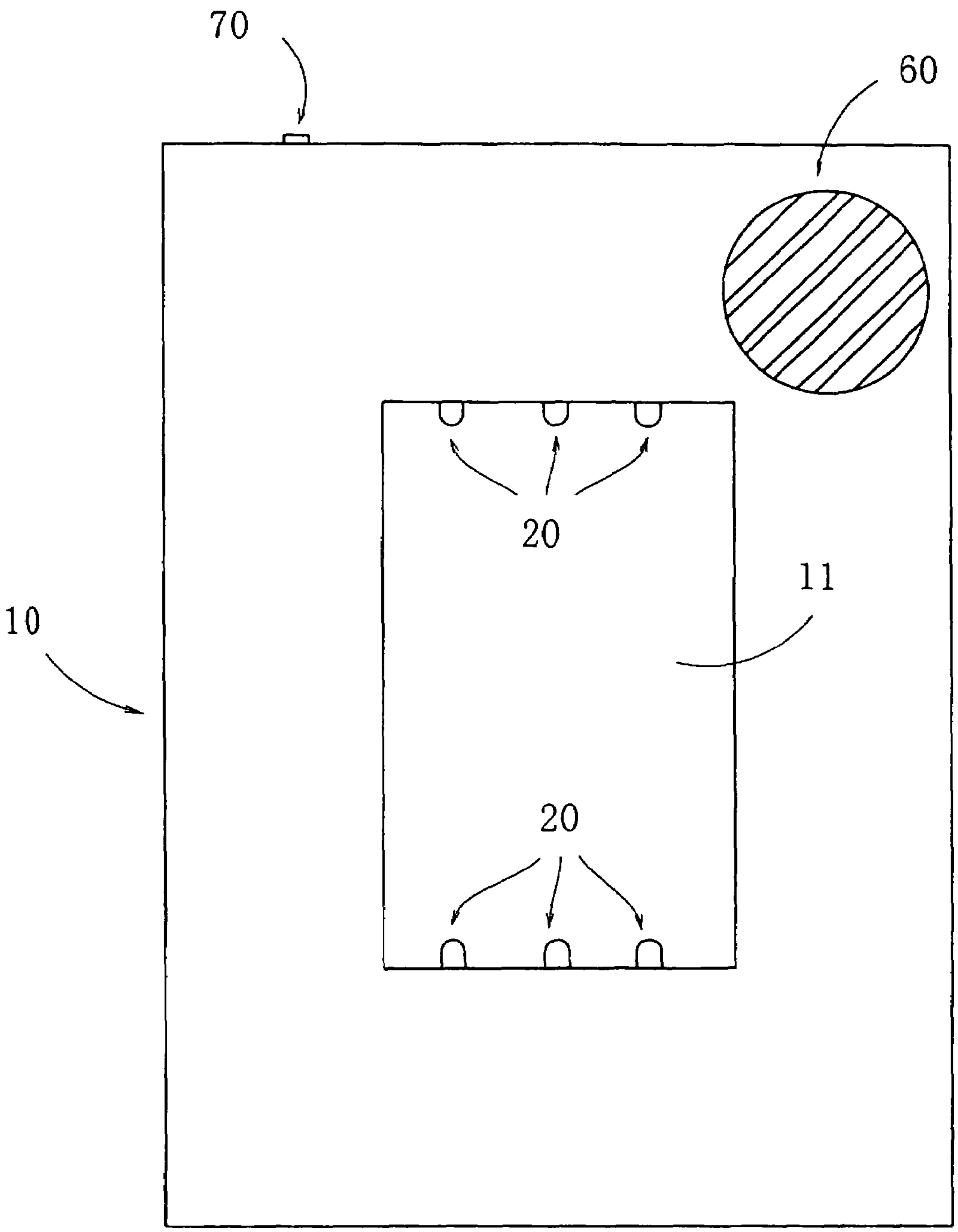
FIG. 2A and FIG. 2B are two side sectional views of the multi-functional cover according to the above preferred embodiment of the present invention.
Figure 2B:
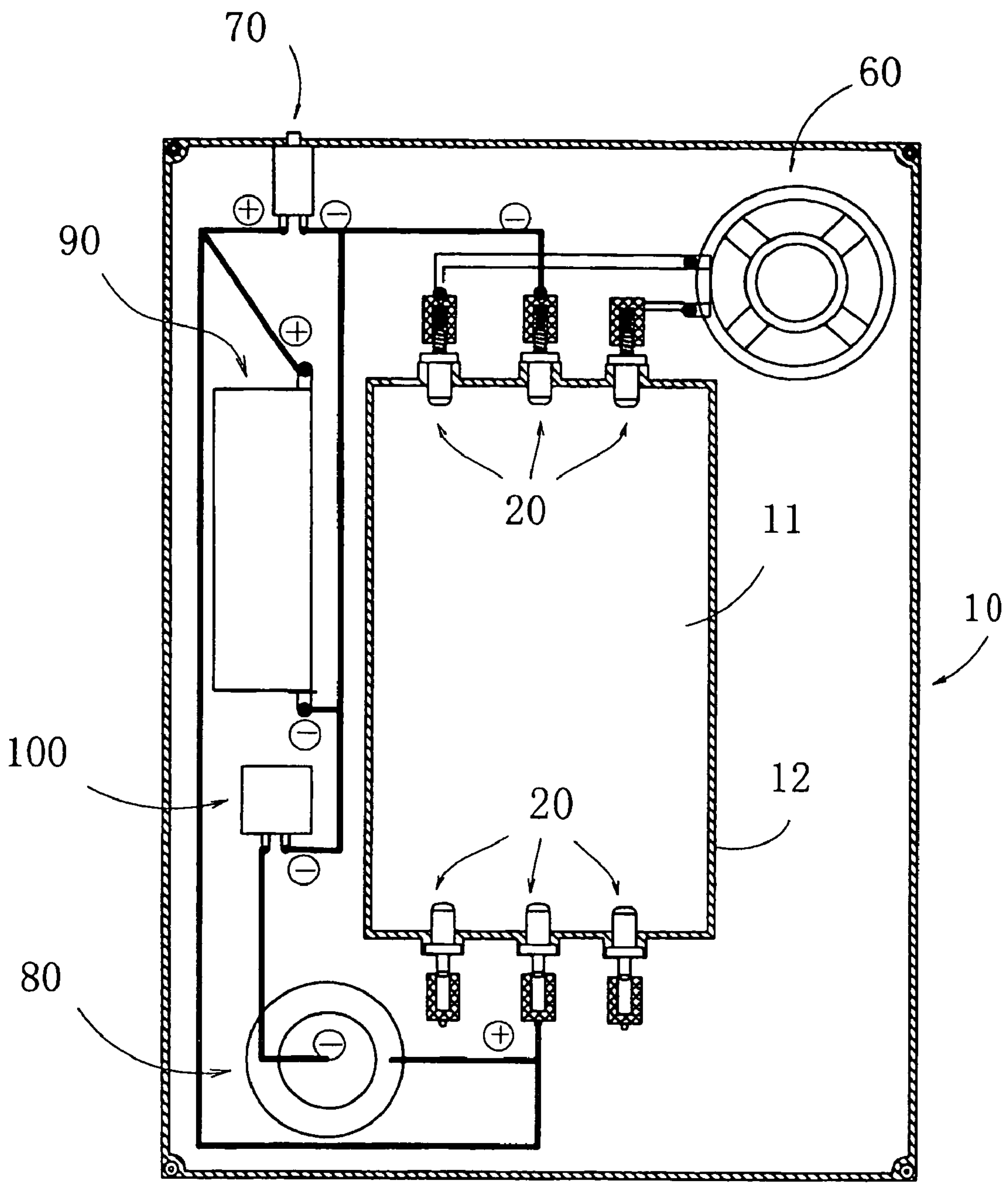
Figure 5B:
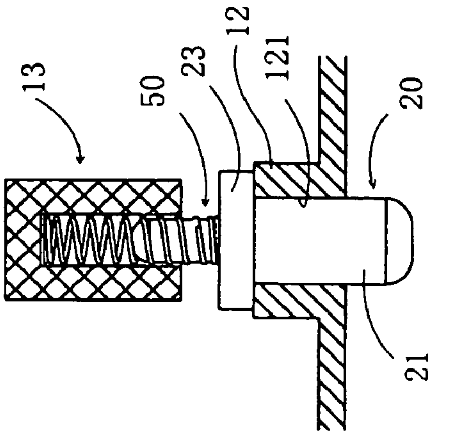
FIG. 5A to FIG. 5B are sectional side views of the window connectors according to the above preferred embodiment of the present invention.
Figure 5A:
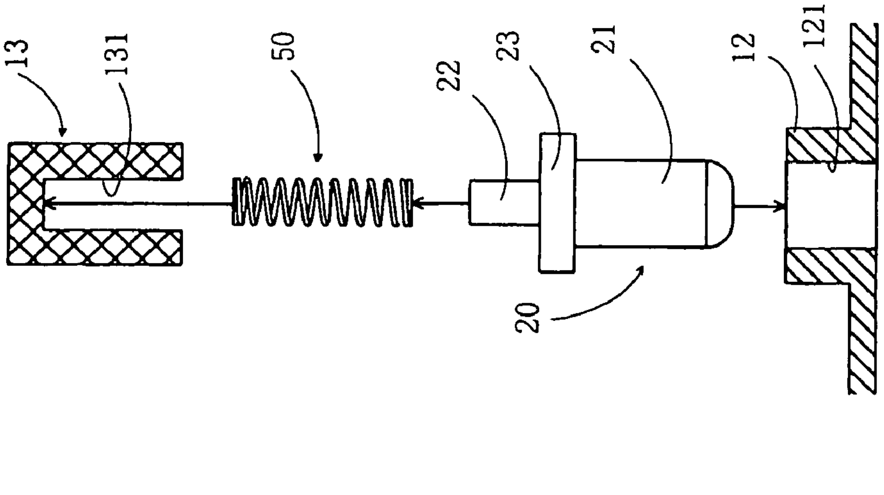

Referring to FIG. 1, FIG. 2A to FIG. 2B of the drawings, a multi-functional cover for a stationary, such as a notebook, according to a preferred embodiment of the present invention is illustrated, in which the multi-functional cover comprises a main body 10, having a receiving cavity, wherein the main body 10 comprises a window boundary 12 formed in the receiving cavity to define a display window 11 communicating the receiving cavity with an exterior of the main body 10, with the window boundary 12 being a peripheral boundary of the display window 11. The multi-functional cover further comprises a plurality of window connectors 20 spacedly provided along a top and a bottom inner side edges of the window boundary 12 respectively. Referring to FIG. 5A to FIG. 5B of the drawings, each of the window connectors 20 comprises a first and a second connector member 21, 22, and a supporting member 23 transversely extended between the first and the second connector members 21, 22, wherein each of the first connector members 21 is movably mounted onto the corresponding position of the window boundary 12, preferably via a mounting slot 121 formed at a corresponding position on the window boundary 12. Moreover, each of the window connectors 20 further comprises an tubular metallic connecting member 13, having a connecting slot 131 formed therein, and a resilient element 50 mounted within the connecting slot 131 of the metallic connecting member 13 for normally exerting an inward biasing force with respect to the window boundary 12, wherein the second connector member 22 of the respective window connector 20 is arranged to mount with the resilient element 50 and receive in the connecting slot 131 of the metallic connecting member 13. Accordingly, each of the window connectors 20 is capable of longitudinally moving with respective to the connecting slot 131 and the mounting slot 121.

Figure 3B:
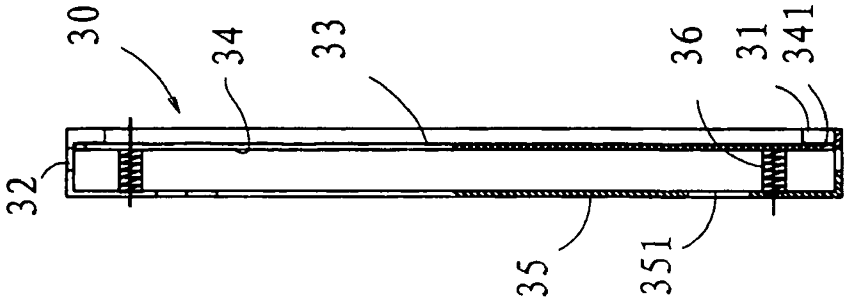
FIG. 3A to FIG. 3C are three schematic diagrams of the main body of the multi-functional cover according to the above preferred embodiment of the present invention.
Figure 3A:
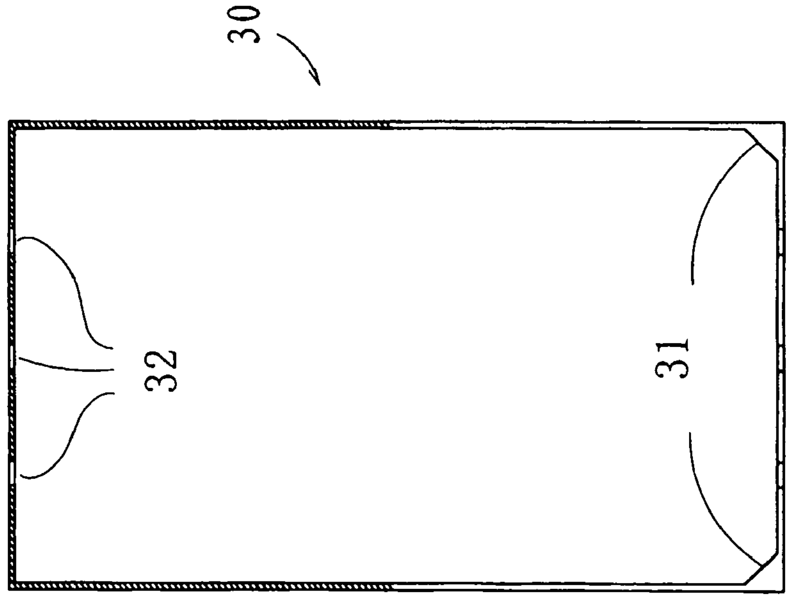
Figure 3C:
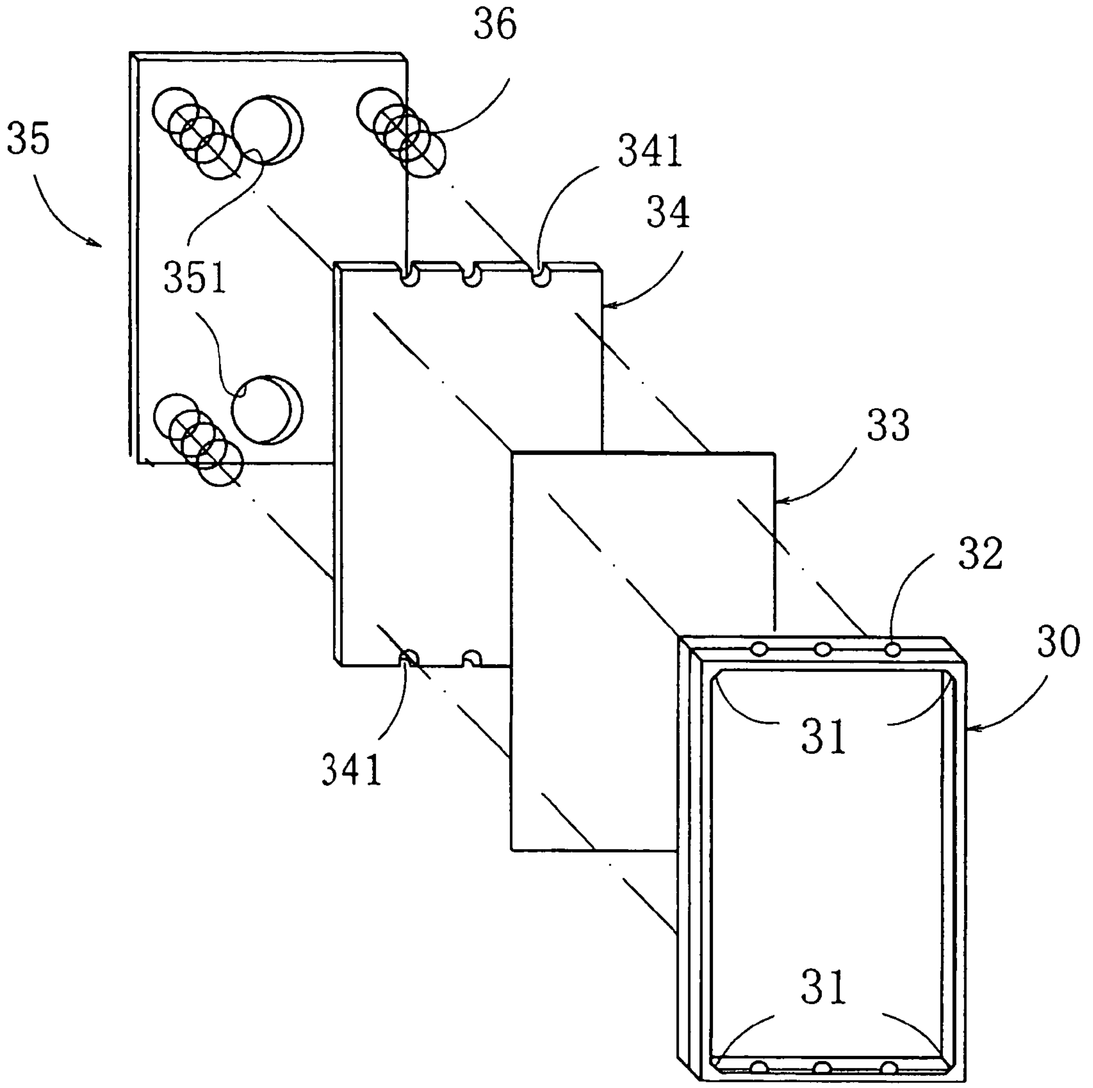

Referring to FIG. 3A to FIG. 3C of the drawings, the multi-functional cover further comprises a supporting frame 30 arranged to detachably attach on the display window 11 of the main body 10, wherein the supporting frame 30 is adapted for such utility accessories as photos, PDAs, and the likes. According to the preferred embodiment of the present invention, the supporting frame 30 can be a picture frame to hold a picture or a photo as the utility accessory. Likewise, the supporting frame 30 can be a PDA holding frame or a music player holding frame for respectively holding the PDA or the portable music player as the utility accessory by the supporting frame 30. The supporting frame 30 comprises a frame holder which is quadrilateral in shape, and has a plurality of accessory blockers 31 formed at four corner portions of the supporting frame 30 for retaining the utility accessories within the display window 11 of the main body 10. Moreover, the supporting frame 30 further has a plurality of through slots 32 spacedly formed on a top and a bottom side of the supporting frame 30, wherein the window connectors 20 are arranged to align with the through slots 32 respectively for connecting the window connectors 20 with the supporting frame 30. The supporting frame 30 further comprises a transparent panel 33, a biasing panel 34, and a rear panel 35 mounted in the frame holder for displaying the utility accessory by the supporting frame 30. For example, where the utility accessory is a photograph, the photograph is sandwiched between the transparent panel 33 and the biasing panel 34. Furthermore, the supporting frame 30 further comprises a plurality of resilient members 36 spacedly mounted at an inner side of the rear panel 35 for normally applying an inward urging force towards the biasing panel 34 so as to normally push the utility accessory (such as the photograph) towards a front side of the supporting frame 30 for displaying the utility accessory through the display window 11. It is worth mentioning that the biasing panel 34 further has a plurality of securing slots 341 spacedly and indently formed on a top and a bottom edge of the biasing panel 34, wherein the securing slots 341 are also well-aligned with the window connectors 20 respectively, in such a manner that each of the window connectors 20 is adapted to electrically connect with the supporting frame 30 through the respective through slot 32 and the securing slot 341. On the other hand, the rear panel 35 further has two pushing holes 351 spacedly formed thereon for allowing a user to push the biasing panel 34 and the transparent panel 33 for conveniently detaching the utility accessory from the supporting frame 30. Accordingly, the supporting frame 30 is shaped and sized to fittedly receive the utility accessory within the frame holder.

Referring to FIG. 1 of the drawings, the multi-functional cover can be incorporated by a utility accessory, such as the PDA shown in FIG. 1. According to the preferred embodiment of the present invention, the multi-functional cover further comprises an affixing arrangement which contains a plurality of affixing slots 41 spacedly formed on the utility accessory at an upper and a bottom side edge of the utility accessory to align with the through slots 32, wherein the window connectors 20 are adapted to connect with the affixing slots 41 of the utility accessory for detachably mounting the utility accessory with the supporting frame 30. The main body 10 further comprises an audio device 60 provided thereon for electrically connecting with the utility accessory, so that the audio device 60 is capable of delivering an audio sound originated from the utility accessory, such as the PDA. Moreover, the main body 10 further comprises a signal inlet 70 provided thereon for electrically connecting with external electrical appliances, such as a laptop or desktop computer, or an external charger. As a result, information exchange between the external electrical appliance and the utility accessory is made possible via the signal inlet 70. In order to further enhance the utility function of the multi-functional cover, it further comprises a lighting device 90 and a power system 80 electrically connected with the lighting device 90 for powering up the lighting device 90 to provide illumination from the multi-functional cover of the present invention. The lighting device 90 comprises a plurality of illuminators, such as LEDs, spacedly mounted on the main body 10 for illuminating the display window 11. It should be noted that the power system 80 may be embodied as a rechargeable battery, or actually an external AC power source for providing adequate electricity for the lighting device 90. In order to control the operation of the lighting device 90, the main body 10 further comprises a control switch 100 provided thereon and electrically connected with the lighting device 90 for allowing a user to control an operation of the lighting device 90 through the control switch 100. It is worth mentioning that the audio device 60, the signal inlet 70 and the power system 80 are electrically connected to the window connectors 20 for transmitting electrical signal between the audio device 60 and the power system 80 via the signal inlet 70.

It is important to mention that since the window connectors 20 are movably mounted onto the supporting frame 30, the utility accessories, such as the PDA 40 or the photograph can be conveniently attached onto and detached from the supporting frame 30 so as to fit different needs of different users.

Moreover, the utility accessory can also be reversed (e.g. a 180 degrees reverse) for performing other functions.

It is also worth mentioning that the multi-functional cover of the present invention can be utilized for displaying photograph by the supporting frame 30, or it can be utilized for incorporating with a PDA, or other utility accessories such as documents.

Figure 4B:
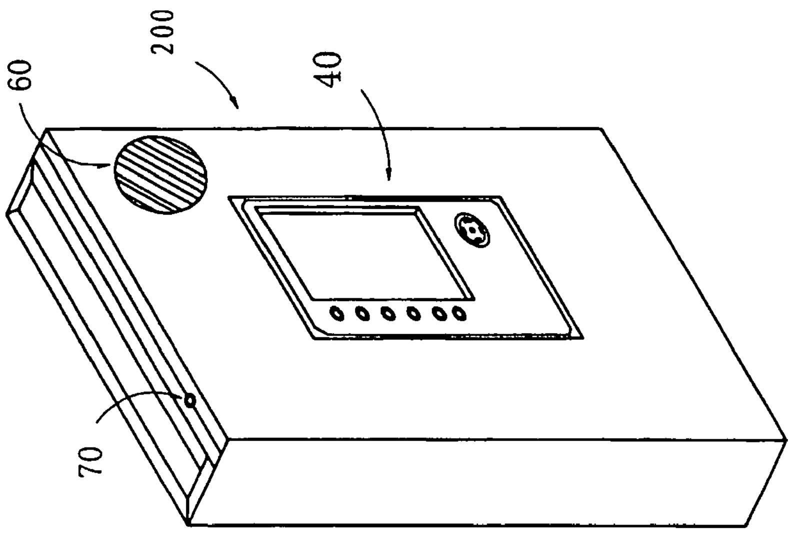
FIG. 4A to FIG. 4D are schematic diagrams of the multi-functional cover according to the above preferred embodiment of the present invention, illustrating that the multi-functional cover can be utilized to perform a wide variety of applications.
Figure 4A:
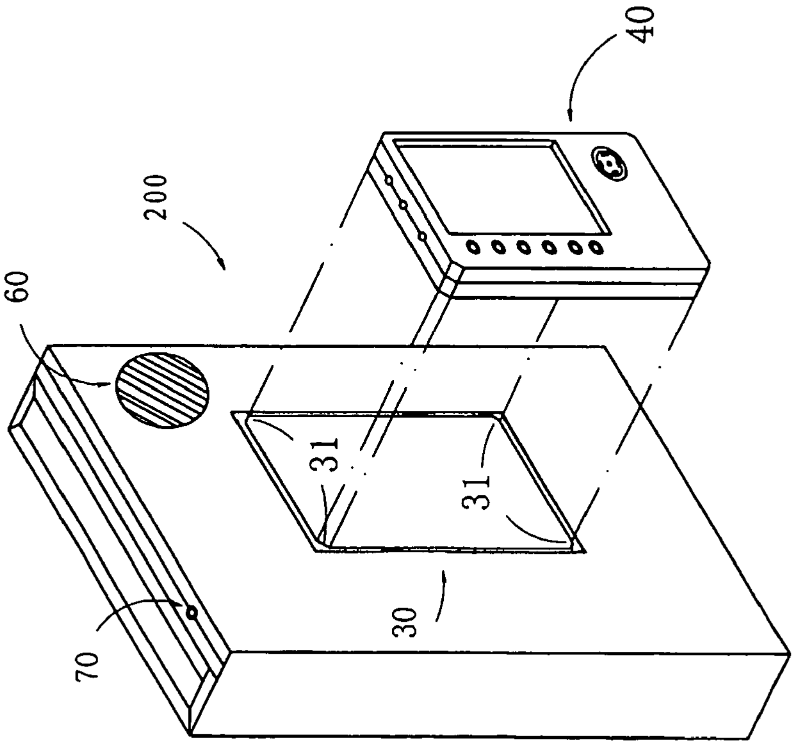
Figure 4C:
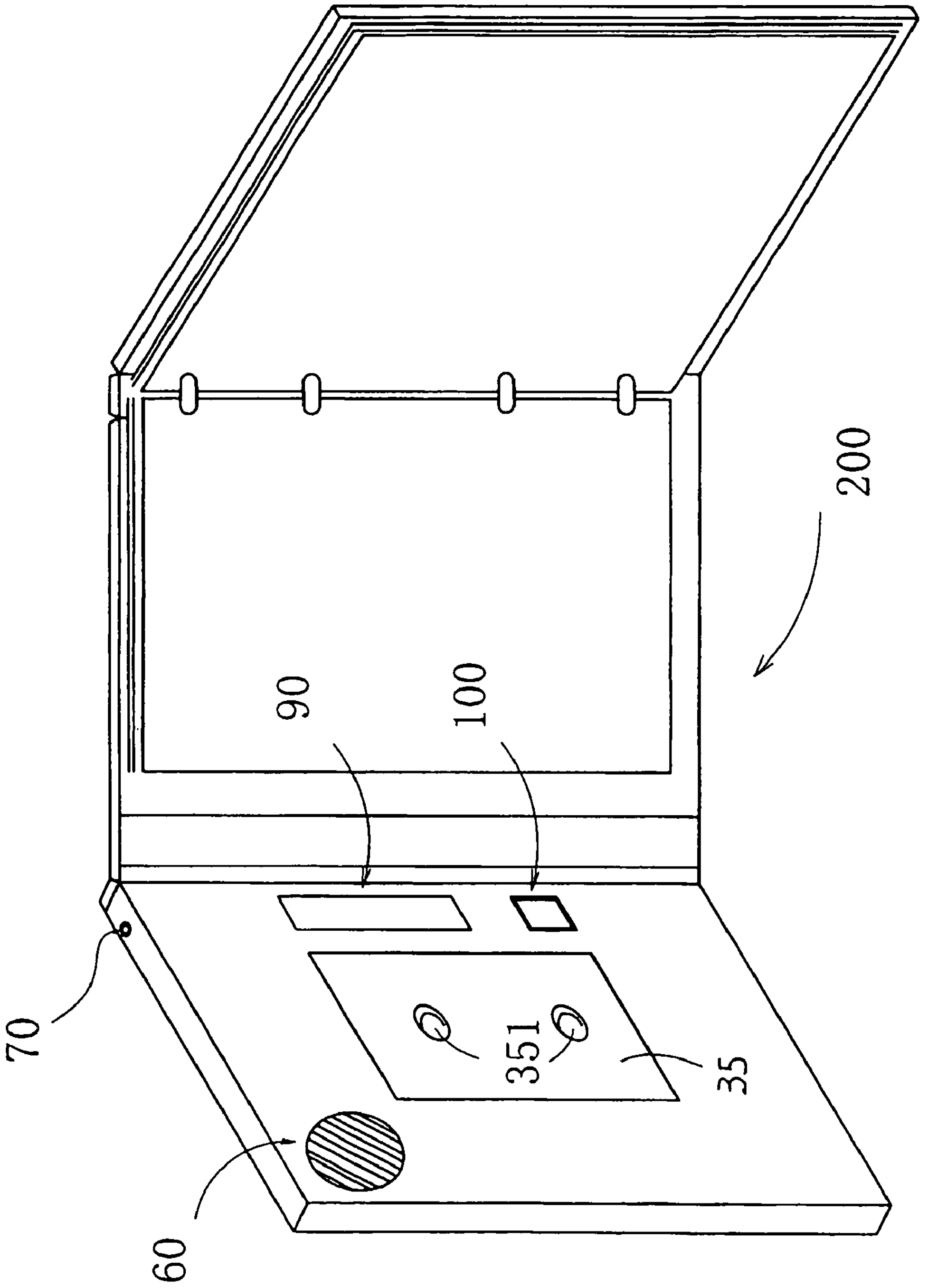
Figure 4D:
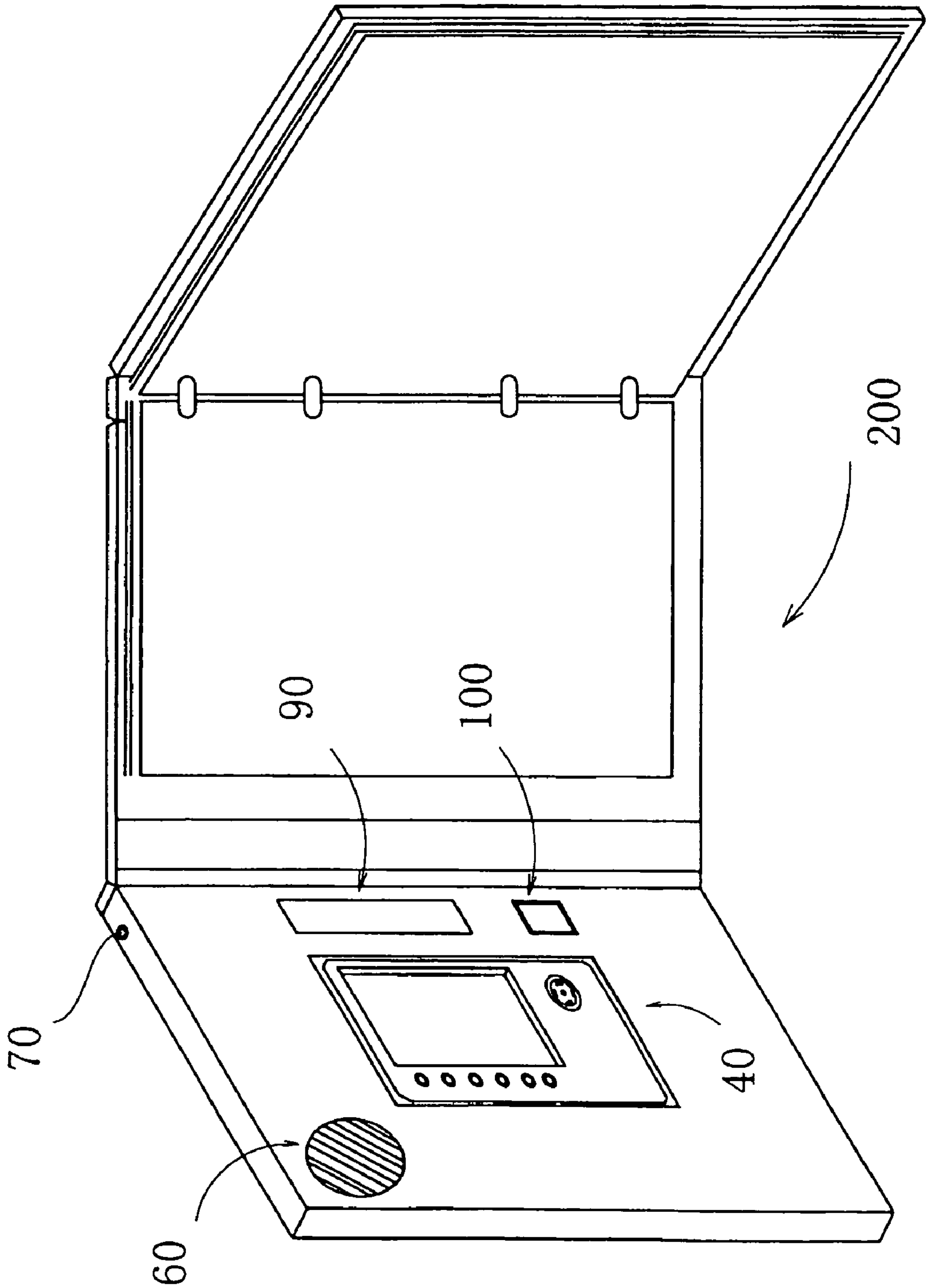

Referring to FIG. 4A to FIG. 4D of the drawings, the multi-functional cover can be incorporated with a book, notebook, or other documents as a cover so as to enhance a utility function of conventional books, notebooks or other documents. For example, the multi-functional cover can be incorporated with a notebook 200. The utility accessories can be a photo displayed by the supporting frame 30, the PDA 40 or a MP3 player (FIG. 4A and FIG. 4B). Referring to FIG. 4C of the drawings, when the notebook 200 is opened, one may observe a rear side of the rear panel 35. Referring to FIG. 4D of the drawings, the multi-functional cover reversely mounted to face an inner side of the notebook 200 so that the PDA is exposed to the user when the notebook 200 is opened. Accordingly, when the user is writing on the notebook, he or she can retrieve additional information conveniently from, say, the PDA, installed side-by-side with the page on which the user is writing. Moreover, the multi-functional cover is also capable of delivering audio signal originated from the PDA or other utility accessory in an amplified manner through the audio device 60. When the environment becomes dark, one may also turn on the lighting device 90 for illumination when they are reading or writing.

Finally, when a PDA (or a MP3 player) and a photograph are both attached into the main body 10, and in order to detach the PDA or other utility accessories from the multi-functional cover of the present invention, one should only slightly push the PDA out of the main body 10 at the two pushing holes 351. It is worth mentioning, however, that when the PDA is detached from the main body 10, the photograph is still attaching to the main body 10 so as to retain an aesthetic appearance of the multi-functional cover.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A multi-functional cover for a writing pad to incorporate a utility accessory thereto, comprising:

a main body having a display window formed thereon, a plurality of window connectors spacedly provided on a peripheral boundary of said display window; and a supporting frame detachably attached on said display window of said main body, wherein said supporting frame is adapted for detachably mounting with said utility accessory so as to detachably mount said utility accessory with said writing pad, and comprises:

a frame holder which is quadrilateral in shape, and has a plurality of accessory blockers formed at four corner portions of said supporting frame for retaining said utility accessory within said display window, wherein said supporting frame further has a plurality of through slots spacedly formed on a top and a bottom side of said supporting frame for said window connectors penetrating said through slots respectively so as to connect said window connectors with said supporting frame, wherein said supporting frame further comprises a transparent panel, a biasing panel, and a rear panel mounted in said frame holder for displaying said utility accessory by said supporting frame; and a plurality of resilient members spacedly mounted at an inner side of said rear panel for normally applying an inward urging force towards said biasing panel so as to normally push said utility accessory towards a front side of said supporting frame to be biased by said accessory blockers for displaying the utility accessory through said display window in a secure manner, wherein said rear panel further has two pushing holes spacedly formed thereon for allowing a user to push said biasing panel and said transparent panel for conveniently detaching said utility accessory from said supporting frame.

2. The multi-functional cover, as recited in claim 1, wherein said supporting frame is shaped and sized to fittedly receive said utility accessory within said frame holder.

3. The multi-functional cover, as recited in claim 1, further comprising an affixing arrangement which contains a plurality of affixing slots spacedly formed on said utility accessory at an upper and a bottom side edge of said utility accessory to align with said through affixing slots, wherein said window connectors are adapted to connect with said affixing slots of said utility accessory for detachably mounting said utility accessory with said supporting frame.

4. The multi-functional cover, as recited in claim 2, further comprising an affixing arrangement which contains a plurality of affixing slots spacedly formed on said utility accessory at an upper and a bottom side edge of said utility accessory to align with said through affixing slots, wherein said window connectors are adapted to connect with said affixing slots of said utility accessory for detachably mounting said utility accessory with said supporting frame.

5. The multi-functional cover, as recited in claim 3, wherein each of said window connectors comprises a first and a second connector member, and a supporting member transversely extended between said first and said second connector members, wherein each of said first connector members is movably mounted onto said corresponding position of said window boundary, each of said window connectors further comprising an tubular metallic connecting member, having a connecting slot formed therein, and a resilient element mounted within said connecting slot of said metallic connecting member for normally exerting an inward biasing force with respect to said window boundary.

6. The multi-functional cover, as recited in claim 4, wherein each of said window connectors comprises a first and a second connector member, and a supporting member transversely extended between said first and said second connector members, wherein each of said first connector members is movably mounted onto said corresponding position of said window boundary, each of said window connectors further comprising an tubular metallic connecting member, having a connecting slot formed therein, and a resilient element mounted within said connecting slot of said metallic connecting member for normally exerting an inward biasing force with respect to said window boundary.

7. The multi-functional cover, as recited in claim 5, wherein said peripheral boundary of said display window has a mounting slot formed thereon, and said second connector member is arranged to mount with said resilient element and to be received in said connecting slot of said metallic connecting member, such that each of said window connectors is capable of longitudinally moving with respective to said connecting slot and said mounting slot.

8. The multi-functional cover, as recited in claim 6, wherein said peripheral boundary of said display window has a mounting slot formed thereon, and said second connector member is arranged to mount with said resilient element and to be received in said connecting slot of said metallic connecting member, such that each of said window connectors is capable of longitudinally moving with respective to said connecting slot and said mounting slot.

9. The multi-functional cover, as recited in claim 1, wherein said main body further comprises an audio device provided thereon for electrically connecting with said utility accessory, a signal inlet provided on said main body for electrically connecting with an external electrical appliance, a lighting device spacedly mounted on said main body for illuminating said display window, a power system electrically connected with said lighting device for powering up said lighting device to provide illumination, and a control switch mounted on said main body and electrically connecting with said lighting device for selectively controlling an operation thereof.

10. The multi-functional cover, as recited in claim 6, wherein said main body further comprises an audio device provided thereon for electrically connecting with said utility accessory, a signal inlet provided on said main body for electrically connecting with an external electrical appliance, a lighting device spacedly mounted on said main body for illuminating said display window, a power system electrically connected with said lighting device for powering up said lighting device to provide illumination, and a control switch mounted on said main body and electrically connecting with said lighting device for selectively controlling an operation thereof.

11. The multi-functional cover, as recited in claim 7, wherein said main body further comprises an audio device provided thereon for electrically connecting with said utility accessory, a signal inlet provided on said main body for electrically connecting with an external electrical appliance, a lighting device spacedly mounted on said main body for illuminating said display window, a power system electrically connected with said lighting device for powering up said lighting device to provide illumination, and a control switch mounted on said main body and electrically connecting with said lighting device for selectively controlling an operation thereof.

12. The multi-functional cover, as recited in claim 8, wherein said main body further comprises an audio device provided thereon for electrically connecting with said utility accessory, a signal inlet provided on said main body for electrically connecting with an external electrical appliance, a lighting device spacedly mounted on said main body for illuminating said display window, a power system electrically connected with said lighting device for powering up said lighting device to provide illumination, and a control switch mounted on said main body and electrically connecting with said lighting device for selectively controlling an operation thereof.

* * * * *